United States Patent
Song et al.

(10) Patent No.: US 9,245,940 B2
(45) Date of Patent: Jan. 26, 2016

(54) INDUCTOR DESIGN ON FLOATING UBM BALLS FOR WAFER LEVEL PACKAGE (WLP)

(71) Applicant: QUALCOMM Incorporated, San Diego, CA (US)

(72) Inventors: Young Kyu Song, San Diego, CA (US); Yunseo Park, San Diego, CA (US); Xiaonan Zhang, San Diego, CA (US); Ryan David Lane, San Diego, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 45 days.

(21) Appl. No.: 14/179,202

(22) Filed: Feb. 12, 2014

(65) Prior Publication Data

US 2015/0228707 A1    Aug. 13, 2015

(51) Int. Cl.
*H01L 27/08* (2006.01)
*H01L 49/02* (2006.01)
*H01L 23/00* (2006.01)
*H01L 23/522* (2006.01)

(52) U.S. Cl.
CPC ............ *H01L 28/10* (2013.01); *H01L 23/5227* (2013.01); *H01L 24/17* (2013.01); *H01L 24/81* (2013.01); *H01L 2224/16225* (2013.01); *H01L 2924/01029* (2013.01); *H01L 2924/30107* (2013.01)

(58) Field of Classification Search
CPC ..... H01L 28/10; H01L 23/5227; H01L 24/81; H01L 2224/16225

USPC ........... 257/531, E21.022, E27.013; 336/200; 438/238

See application file for complete search history.

(56) References Cited

U.S. PATENT DOCUMENTS

| | | | |
|---|---|---|---|
| 6,710,433 B2 * | 3/2004 | Megahed et al. ............. | 257/678 |
| 8,471,358 B2 | 6/2013 | Yen et al. | |
| 2003/0218247 A1 * | 11/2003 | Shimoishizaka et al. ..... | 257/734 |
| 2005/0263847 A1 * | 12/2005 | Anzai et al. .................... | 257/531 |
| 2006/0170072 A1 * | 8/2006 | Nakashiba ..................... | 257/531 |
| 2007/0279176 A1 | 12/2007 | Chen et al. | |
| 2008/0191349 A1 | 8/2008 | Aoki | |
| 2011/0031584 A1 | 2/2011 | Kotani | |
| 2013/0127060 A1 | 5/2013 | Aboush | |
| 2013/0241683 A1 | 9/2013 | Tsai et al. | |

OTHER PUBLICATIONS

International Search Report and Written Opinion—PCT/US2015/015450—ISA/EPO—May 15, 2015.

* cited by examiner

*Primary Examiner* — Jasmine Clark
(74) *Attorney, Agent, or Firm* — Muncy, Geissler, Olds & Lowe, P.C.

(57) ABSTRACT

An inductor design on a wafer level package (WLP) does not need to depopulate the solder balls on the die because the solder balls form part of the inductor. One terminal on the inductor couples to the die, the other terminal couples to a single solder ball on the die, and the remaining solder balls that mechanically contact the inductor remain electrically floating. The resulting device has better inductance, direct current (DC) resistance, board-level reliability (BLR), and quality factor (Q).

23 Claims, 6 Drawing Sheets

INDUCTOR DESIGN ON FLOATING UBM BALLS FOR WAFER LEVEL PACKAGE (WLP)

FIELD OF DISCLOSURE

Aspects of the present disclosure relate generally to semiconductor packaging, and in particular to semiconductor packaging that implements an inductor design for wafer level packaging and improved board level reliability.

BACKGROUND

A wireless device (e.g., a cellular phone or a smart phone) may include a transmitter and a receiver coupled to an antenna to support two-way or multiple-way communication. The transmitter may modulate a radio frequency (RF) carrier signal with voice and/or data to obtain a modulated signal, amplify the modulated signal to obtain an output RF signal having the proper output power level using one or more power amplifiers, and transmit the output RF signal via the antenna to a base station.

Inductors are an integral part of power amplifiers used for wireless communication. For example, inductors can be used in tank circuits, as chokes, etc. When integrating inductors into devices board-level reliability is a major concern. For example, concerns have been raised about the possible effects of solder voids, temperature cycling, mechanical vibration, electromigration, etc., on board-level reliability.

One traditional solution is to implement one or more inductors on a chip using surface mount technology (SMT). This solution requires the inductors to be mounted external to the chip, however. One consequence of this solution is that the choke inductor in the power amplifier is removed and replaced with the SMT inductor. Replacing the choke inductor with the SMT inductor causes the power amplifier to have a reduced noise margin.

Another traditional solution is to embed the inductors in a package substrate. This solution has challenges as well. For example, embedding inductors in a package substrate results in increased packaging costs. Additionally, embedding inductors in a package substrate results in a larger package because of the extra space needed for the inductors.

Still another traditional solution is to implement the inductors on a laminated substrate using land grid array (LGA) technology. This implementation uses a spiral inductor embedded in the substrate using solder balls on the substrate. FIG. 1 depicts a conventional substrate forming a die 102 for implementing an inductor. The die 102 includes several solder balls 104*a*-104*z*. When an inductor is implemented on the die 102, some of the solder balls have to be depopulated. For example, FIG. 1 shows (using dotted lines) that solder balls 104*k*, 104*l*, 104*p*, and 104*q* have to be depopulated for optimum performance of the inductor. If some of the solder balls are depopulated, however, density requirements for solder balls may be violated. For example, to meet board level reliability standards thermal and/or mechanical requirements must be met when there are fewer solder connections between the die 102 and a printed circuit board (PCB).

The alternative is to leave all solder balls on the die 102. If the solder balls 104*k*, 104*l*, 104*p*, and 104*q* are not depopulated from the die 102, the solder balls 104*k*, 104*l*, 104*p*, and 104*q* are said to "float" because they are not electrically coupled to the die 102 when the inductor is integrated on the die 102. Unfortunately, floating solder balls cause high eddy currents, which results in lowered inductance of the inductor, higher direct current (DC) resistance (Rdc) for the inductor, and low quality factor (Q) of the inductor.

Also, the values for L, Rdc, and Q are subject to change due to process variations. If the values for inductance vary, there needs to be a way to compensate for the variations, such as by including a variable capacitance in the package. This added component causes the bill of materials to increase, causes the cost of manufacturing to increase, and causes the size of the package to increase.

Thus, improved apparatuses and methods for implementing an inductor, in a power amplifier, for example, are needed.

SUMMARY

Example implementations of the technology described herein are directed to apparatuses, systems, methods, and computer-readable media for an inductor design on floating solder balls for a wafer level package (WLP). Features of the inductor design are that the inductor design is compatible with board level reliability standards, does not involve depopulating solder balls, and still maintains the inductance and quality factor (Q) of the inductor.

In one or more implementations, a semiconductor device includes a die populated with a first interconnect and a plurality of remaining interconnects. The semiconductor device also includes an inductor disposed in the die. The inductor includes first terminal that is electrically and mechanically coupled to the die. The inductor also includes a second terminal that is electrically and mechanically coupled to the die using the first interconnect. The inductor includes a remaining portion that is mechanically coupled to the plurality of remaining interconnects but not electrically coupled to the plurality of remaining interconnects.

In some implementations, the first interconnect may be a solder ball that is electrically coupled to the die using an under bump metallization (UBM) layer, the semiconductor device is integrated in at least one of a wafer level package (WLP), flip-chip ball grid array (FCBGA) package, and a flip-chip chip-scale package (FCCSP), the inductor is disposed in a single layer on the die, and the inductor is two-dimensional.

In another implementation, a semiconductor device includes a die populated with a first interconnect and a plurality of remaining interconnects. The semiconductor device also includes a printed circuit board (PCB). The semiconductor device further includes an inductor disposed in the die. The inductor includes a first terminal that is electrically and mechanically coupled to the die and a second terminal that is electrically and mechanically coupled to the printed circuit board (PCB) using the first interconnect. The remaining portion of the inductor is mechanically coupled to the plurality of remaining interconnects but not electrically coupled to the remaining interconnects.

In a further implementation, a semiconductor device includes a die populated with a first interconnect and a plurality of remaining interconnects. The semiconductor device also includes a printed circuit board (PCB). The semiconductor device further includes an inductor disposed in the printed circuit board. The inductor includes a first terminal that is electrically and mechanically coupled to the printed circuit board using the first interconnect. The inductor also includes a second terminal that is electrically and mechanically coupled to the die. The inductor includes a remaining portion that is mechanically coupled to the plurality of remaining interconnects but not electrically coupled to the plurality of remaining interconnects.

In still another implementation, a method of manufacturing a semiconductor device includes providing a die populated with a first interconnect and a plurality of remaining interconnects. The method of manufacturing the semiconductor device also includes disposing an inductor in the die. The inductor includes a first terminal that is electrically and mechanically coupled to the die and a second terminal that is electrically and mechanically coupled to the die using the first interconnect. The inductor also includes a remaining portion that is mechanically coupled to the plurality of remaining interconnects but not electrically coupled to the plurality of remaining interconnects.

In still another implementation, a semiconductor device comprises means for providing a die populated with a first interconnect and a plurality of remaining interconnects and means for disposing an inductor in the die. The means for disposing the inductor in the die comprises means for forming a first terminal, means for electrically and mechanically coupling the first terminal to the die, means for forming a second terminal, means for electrically and mechanically coupling the second terminal to the die using the first interconnect, means for forming a remaining portion of the inductor, and means for mechanically coupling the remaining portion of the inductor to the plurality of remaining interconnects but not electrically coupling the remaining portion of the inductor to the plurality of remaining interconnects.

A non-transitory computer-readable media may implement one or more of the methods described herein. Moreover, the semiconductor device/assembly may be implemented in a wired or wireless device.

Above is a simplified Summary relating to one or more implementations described herein. As such, the Summary should not be considered an extensive overview relating to all contemplated aspects and/or implementations, nor should the Summary be regarded to identify key or critical elements relating to all contemplated aspects and/or implementations or to delineate the scope associated with any particular aspect and/or implementation. Accordingly, the Summary has the sole purpose of presenting certain concepts relating to one or more aspects and/or implementations relating to the mechanisms disclosed herein in a simplified form to precede the detailed description presented below.

BRIEF DESCRIPTION OF THE DRAWINGS

The accompanying drawings are presented to aid in the description of the technology described herein and are provided solely for illustration of the implementations and not limitation thereof.

DETAILED DESCRIPTION

In general, the subject matter disclosed herein is directed to systems, methods, apparatuses, and computer-readable media for an inductor design on floating interconnects and/or solder balls for a wafer level package (WLP). In one or more implementations, the inductor design does not involve depopulating solder balls on the wafer/die. The floating solder balls form part of the inductor.

One feature of the technology described herein is that there is a lower direct current (DC) resistance in the inductor. This is because there is a larger current passing through the inductor using the under bump metallization (UBM) pads of the inductor.

Another feature of the technology described herein is that there is an increased inductance for the inductor. This is because the floating solder balls are part of the inductor and allow for one more turn in the spiral inductor.

Another feature of the technology described herein is that a high quality factor (Q) is achieved without depopulating the solder balls 104k, 104l, 104p, and 104q. For example, the quality factor (Q) for an inductor can be found through the following formula:

$$Q = \frac{\omega L}{R}$$

where ω is the radian operating frequency, L is the inductance of the inductor, and R is the inductor's effective series resistance, and the product ωL is the inductive reactance of the inductor. Therefore, the inductor described herein can achieve a higher quality factor (Q) because there is a lower effective series resistance (R) and a higher inductance (L).

Another feature of the technology described herein is that it enables greater voltage headroom in a power amplifier in which the inductor is implemented. For example, using the inductor implemented according to the technology described herein there is a lower parasitic resistance in the inductor. With the lower parasitic resistance, Ohm's Law (V=I*R, where V is voltage, I is current, and R is resistance) mandates that the inductor will drop more voltage. Thus, there is larger voltage headroom for the inductor.

Another feature of the technology described herein is that the power amplifier can achieve higher power-added-efficiency (PAE) and power amplifier gain. For example, the lower parasitic resistance in the inductor results in lower power losses. The lower power losses result in higher power-added-efficiency (PAE).

Still another feature of the technology described herein is that eddy currents are reduced or eliminated because an inductor integrated in the package is two-dimensional rather than three-dimensional. That is, the inductor is disposed in a single layer on the package. This also results in greater board level reliability (BLR).

Figure 1:
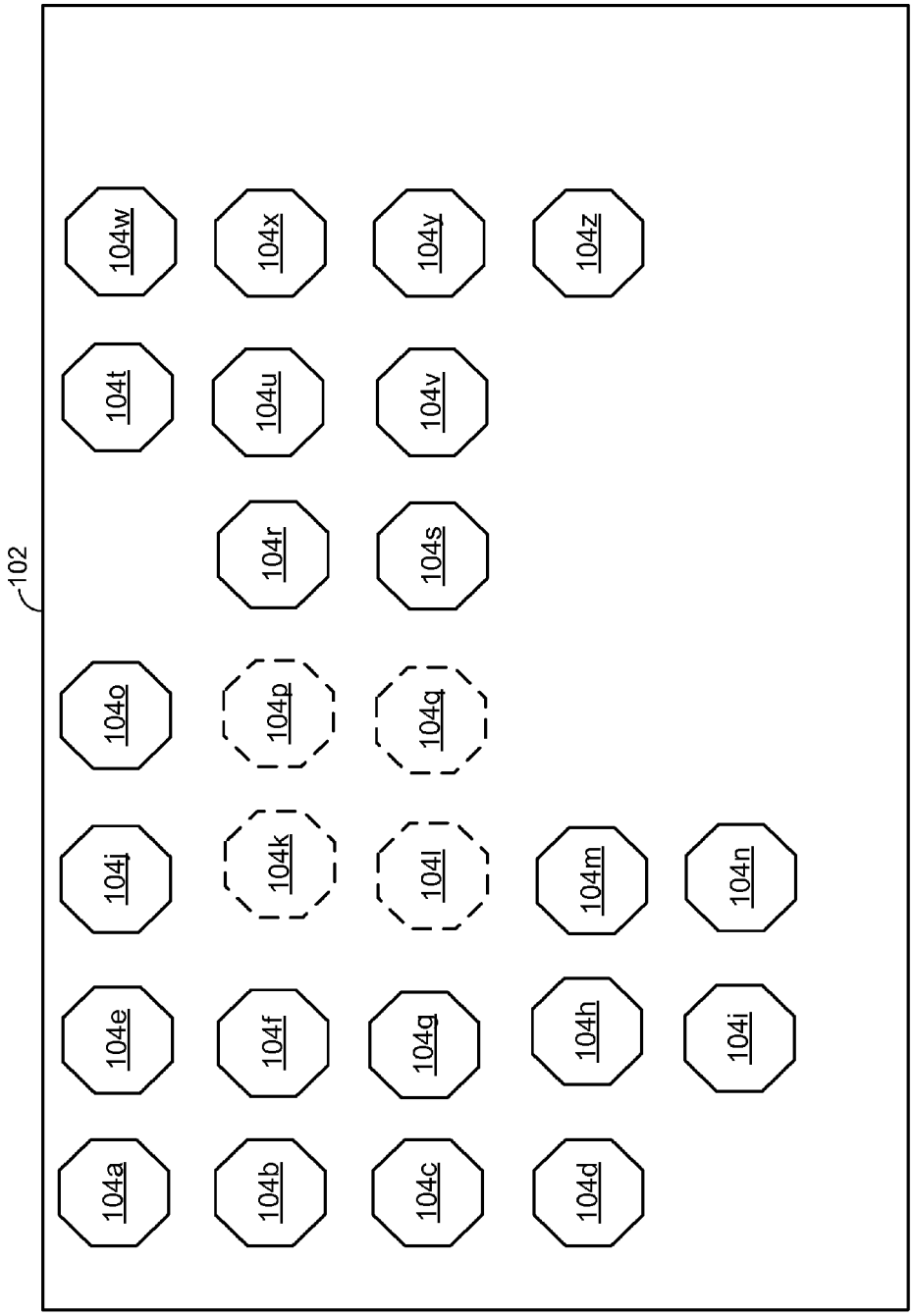
FIG. 1 is a top view of a conventional substrate for implementing an inductor.
Figure 2:
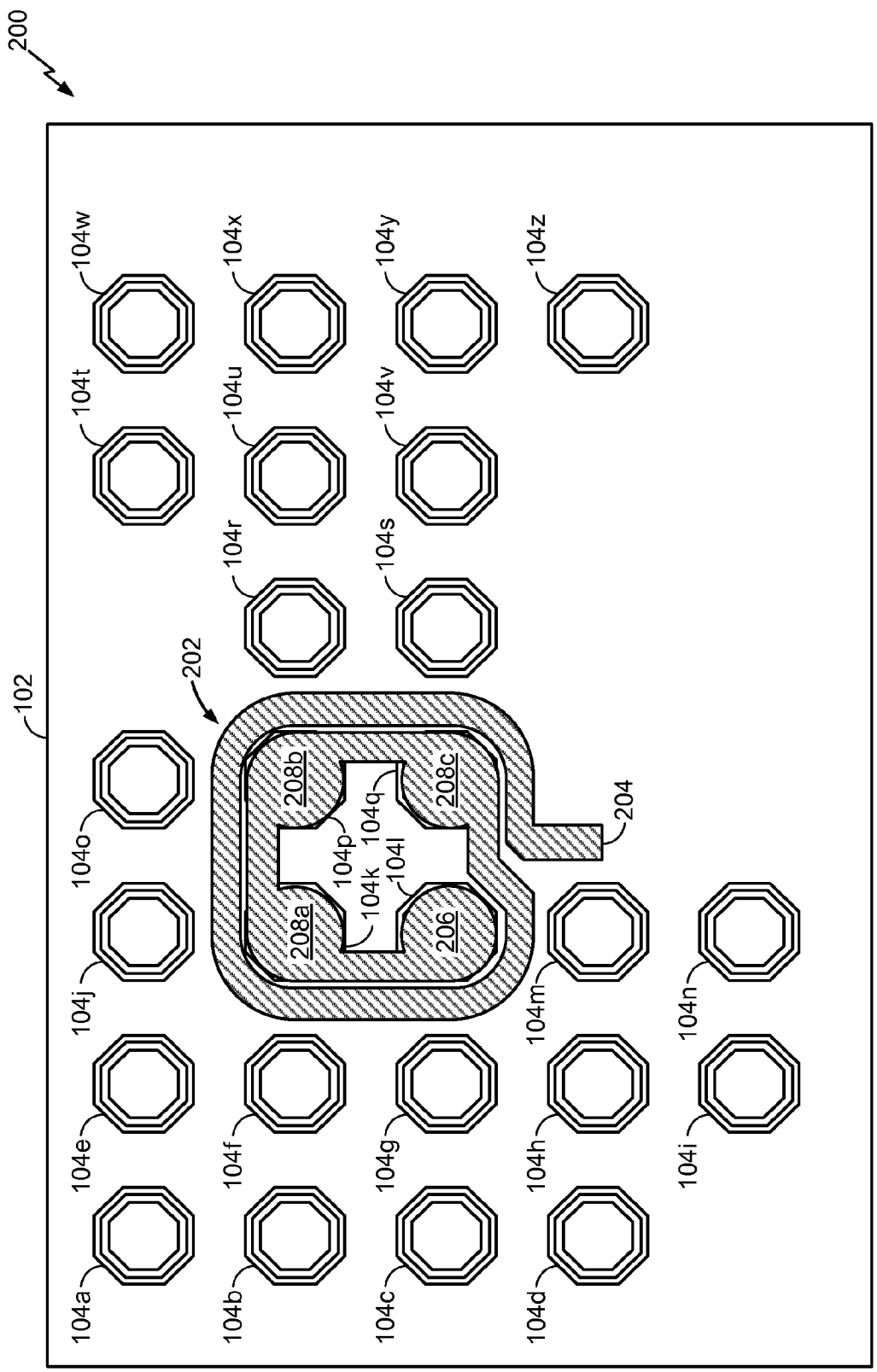
FIG. 2 is a top view of a substrate having an inductor disposed therein according to one or more implementations of the technology described herein.

FIG. 2 is a top view of semiconductor device 200 having the die 102 fully populated with solder balls 104a-104z. Although illustrated as having solder balls 104a-104z, the die 102 may be populated with any suitable interconnect.

In one or more implementations, the semiconductor device 200 is a wafer level package (WLP), a flip-chip ball grid array (FCBGA) package, or a flip-chip chip-scale package (FCCSP), as opposed to a laminate package substrate.

An inductor 202 is disposed on a portion of the solder balls 104a-104z. In the illustrated implementation, the inductor 202 is disposed on the solder balls 104k, 104l, 104p, and 104q. Thus, none of the solder balls 104a-104z has been depopulated from the die 102 to accommodate the inductor 202. The solder balls 104k, 104p, and 104q are left to "float" electrically. Leaving the solder balls 104k, 104p, and 104q populated with the inductor 202 disposed thereon allows the solder balls 104*k*, 104*l*, 104*p*, and 104*q* to provide mechanical support for the inductor 202 that is not provided in traditional inductor implementations on laminated substrates. Leaving the solder balls 104*k*, 104*l*, 104*p*, and 104*q* populated with the inductor 202 disposed thereon also allows the solder balls 104*k*, 104*l*, 104*p*, and 104*q* to form part of the inductor 202.

In the illustrated implementation, the inductor 202 includes a first terminal 204, a second terminal 206, and a remaining portion 208*a*-208*c*. The first terminal 204 is electrically and mechanically coupled to the die 102 using a metal trace (not shown). The second terminal 206 is electrically and mechanically coupled to the die 102 using the solder ball 104*l*, which is coupled to an under bump metallization (UBM) layer (not shown). The remaining portion 208*a*-208*c* of the inductor 202 is mechanically coupled to the solder balls 104*k*, 104*p*, and 104*q*, but not electrically coupled to the die 102 or the solder balls 104*k*, 104*p*, and 104*q*. The solder balls 104*k*, 104*p*, and 104*q* are electrically floating.

Figure 3:
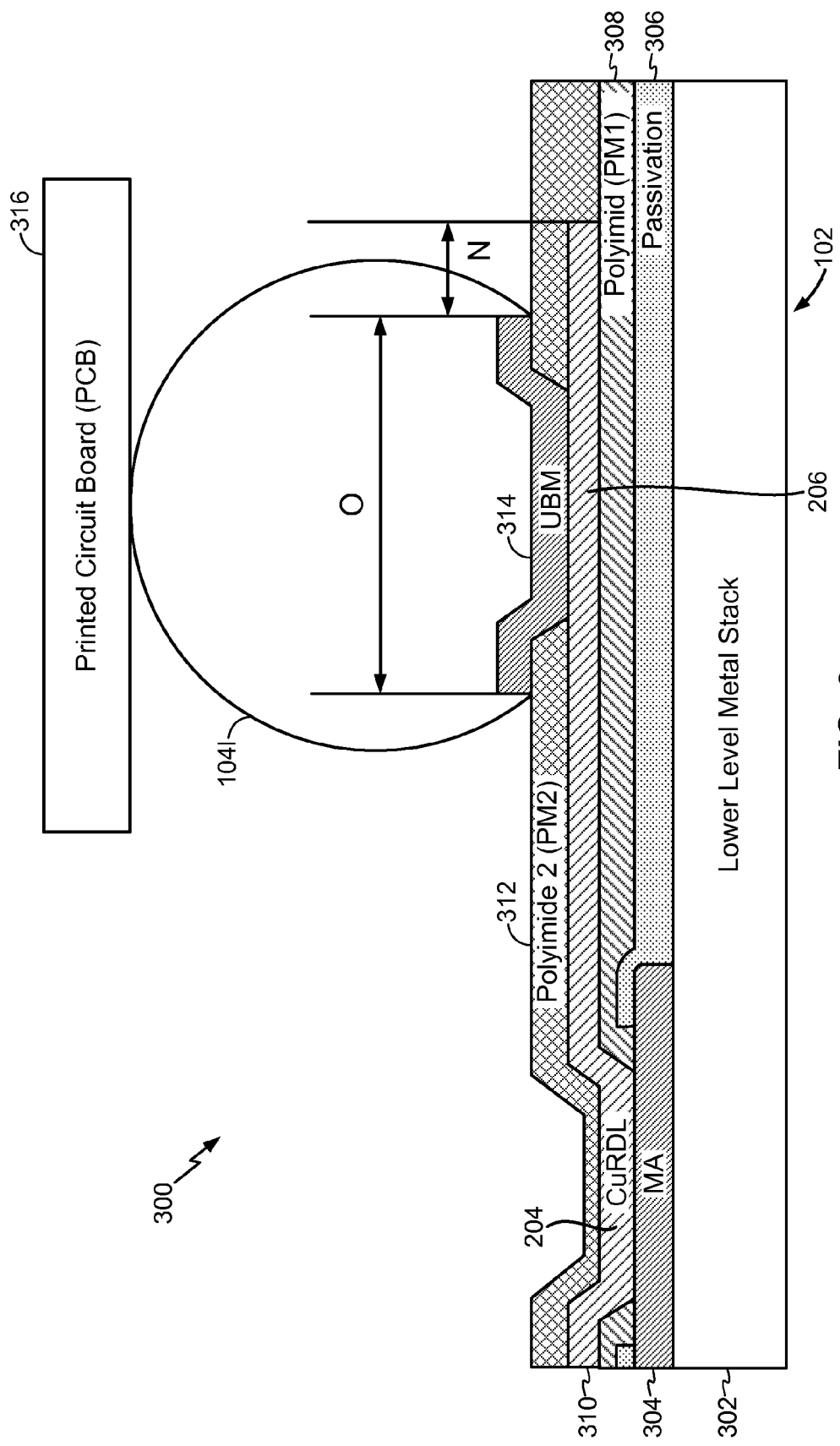
FIG. 3 is a cross-sectional view of a semiconductor assembly according to one or more implementations of the technology described herein.

FIG. 3 is a cross-sectional view of a portion of the semiconductor device 200 implemented in a semiconductor assembly 300 according to one or more implementations of the technology described herein. The illustrated implementation depicts the die 102 having a lower level metal stack 302 and a top metal layer (MA layer) 304 disposed on the lower level metal stack 302.

A passivation layer 306 also disposed on the lower level metal stack 302 and the MA layer 304. The passivation layer may be any suitable oxide. A first polyimide layer 308 is disposed on the passivation layer 306 and the MA layer 304.

A copper redistribution layer (CuRDL) 310 is disposed on the MA layer 304 and the polyimide layer (PM1) 308 to form the inductor 202. The copper redistribution layer (CuRDL) 310 may be in a spiral design that takes a circular turn from one inductor 202 terminal to the other inductor 202 terminal. One inductor 202 terminal may be coupled to a pad on the polyimide layer (PM1) 308 while another inductor 202 terminal may be coupled to the MA layer 304.

In the illustrated implementation, terminal 204 is coupled to the copper redistribution layer (CuRDL) 310 via one or more pads on the polyimide layer (PM1) 308. Also in the illustrated implementation, terminal 206 is coupled to the copper redistribution layer (CuRDL) 310 via one or more pads on the MA layer 304.

In an alternative implementation, terminal 206 is coupled to the copper redistribution layer (CuRDL) 310 via one or more pads on the polyimide layer (PM1) 308 and terminal 204 is coupled to the copper redistribution layer (CuRDL) 310 via one or more pads on the MA layer 304. The copper redistribution layer (CuRDL) 310 may be any suitable electrically conductive tape.

A second polyimide layer (PM2) 312 is disposed on the polyimide layer (PM1) 308 and the copper redistribution layer (CuRDL) 310. An under bump metallization (UBM) layer 314 is disposed on the second polyimide layer (PM2) 312 and the copper redistribution layer (CuRDL) 310. Solder ball 104*l* is disposed on the under bump metallization (UBM) layer 314. A printed circuit board (PCB) 316 disposed on the solder ball 104*l*.

In the illustrated implementation, the copper redistribution layer (CuRDL) 310 forms at least a portion of the inductor 202. For example, the portion of the copper redistribution layer (CuRDL) 310 that is coupled to the MA layer 304 may be the first terminal 204 of the inductor 202, and the portion of the copper redistribution layer (CuRDL) 310 that is coupled to the under bump metallization (UBM) layer 314 may be the second terminal 206 of the inductor 202. The remaining portion of the copper redistribution layer (CuRDL) 310 remains electrically isolated from the die 102 using the passivation layer 306 and the second polyimide layer (PM2) 312.

In one or more implementations, a lower direct current (DC) resistance (Rdc) for the inductor 202 is accomplished by having a wide copper redistribution layer (CuRDL) 310 coupled to a large copper redistribution layer (CuRDL) 310 pad on the first polyimide layer (PM1) 308. A lower direct current (DC) resistance (Rdc) for the inductor 202 also is accomplished because the solder balls 104*k*, 104*l*, 104*p*, and 104*q* are not depopulated. Also, having the solder balls 104*k*, 104*l*, 104*p*, and 104*q* form part of the inductor 202 decreases the direct current (DC) resistance (Rdc) and improves the board level reliability for the inductor 202. Moreover, having the inductor 202 take a circular turn from the first polyimide layer (PM1) 308 pads improves magnetic flux of the assembly, which improves the inductance of the inductor 202.

Typically, if the solder balls 104*k*, 104*l*, 104*p*, and 104*q* are not depopulated, there are eddy currents that disturb the magnetic field propagation, leading to inductance degradation. Not having to depopulate the solder balls 104*k*, 104*l*, 104*p*, and 104*q* from the die 102 eliminates degradation due to this so-called "ball effect."

Figure 4:
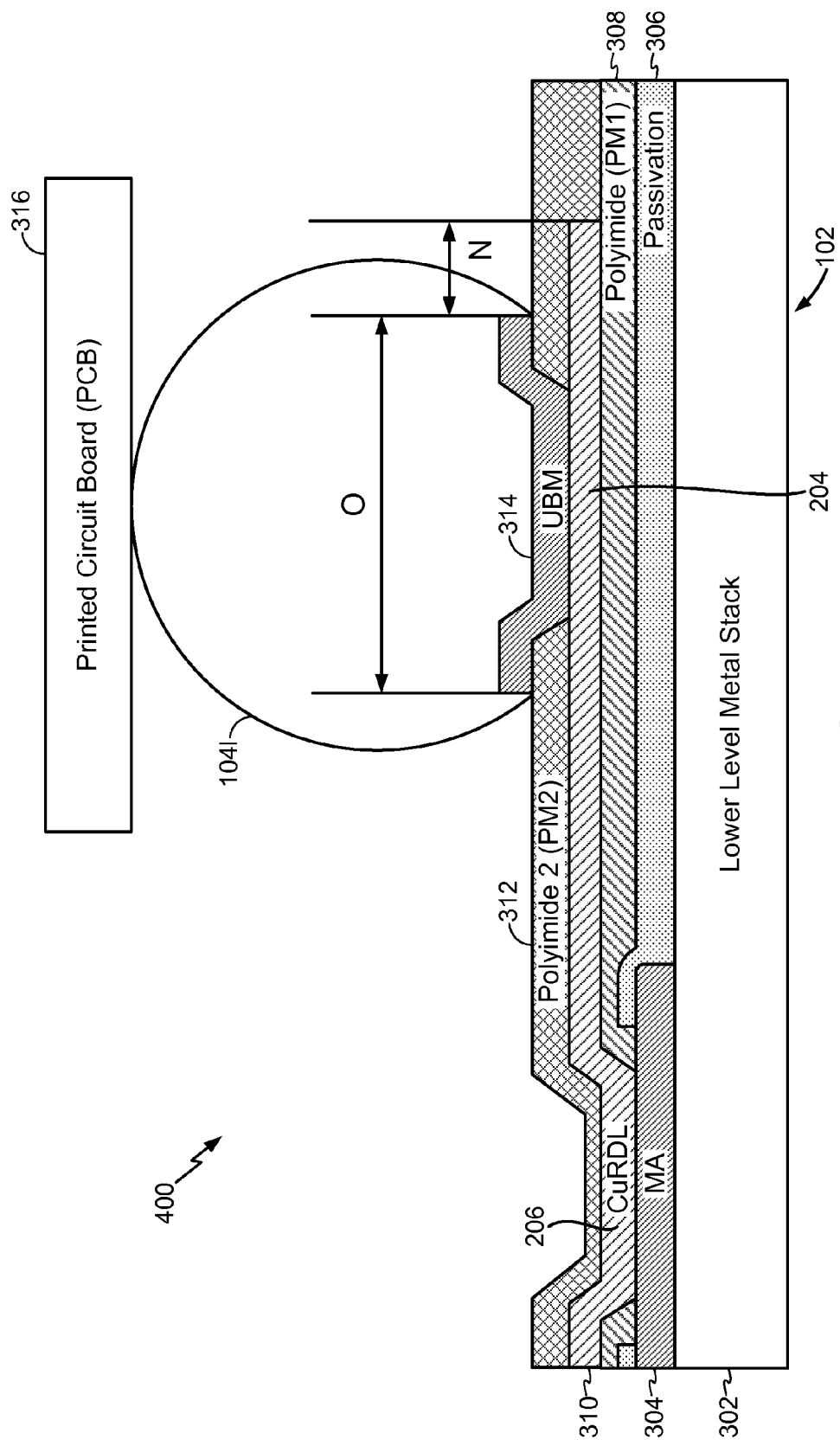
FIG. 4 is a cross-sectional view of a semiconductor device according to one or more implementations of the technology described herein.

FIG. 4 is a cross-sectional view of a portion of the semiconductor device 200 implemented in a semiconductor assembly 400 according to one or more alternative implementations of the technology described herein. The illustrated implementation is similar to the semiconductor assembly 300 in that it includes the die 102 having lower level metal stack 302, the MA layer 304, passivation layer 306, first polyimide layer (PM1) 308, the copper redistribution layer (CuRDL) 310, polyimide layer (PM2) 312, under bump metallization (UBM) layer 314, solder ball 104*l*, and printed circuit board (PCB) 416.

In the implementation illustrated in FIG. 4, however, the portion of the copper redistribution layer (CuRDL) 310 that is coupled to the MA layer 304 may be the second terminal 206 of the inductor 202, and the portion of the copper redistribution layer (CuRDL) 310 that is coupled to the under bump metallization (UBM) layer 314 may be the first terminal 204 of the inductor 202. The remaining portion of the copper redistribution layer (CuRDL) 310 remains electrically isolated from the die 102 using the passivation layer 306 and the second polyimide layer (PM2) 312.

Figure 5:
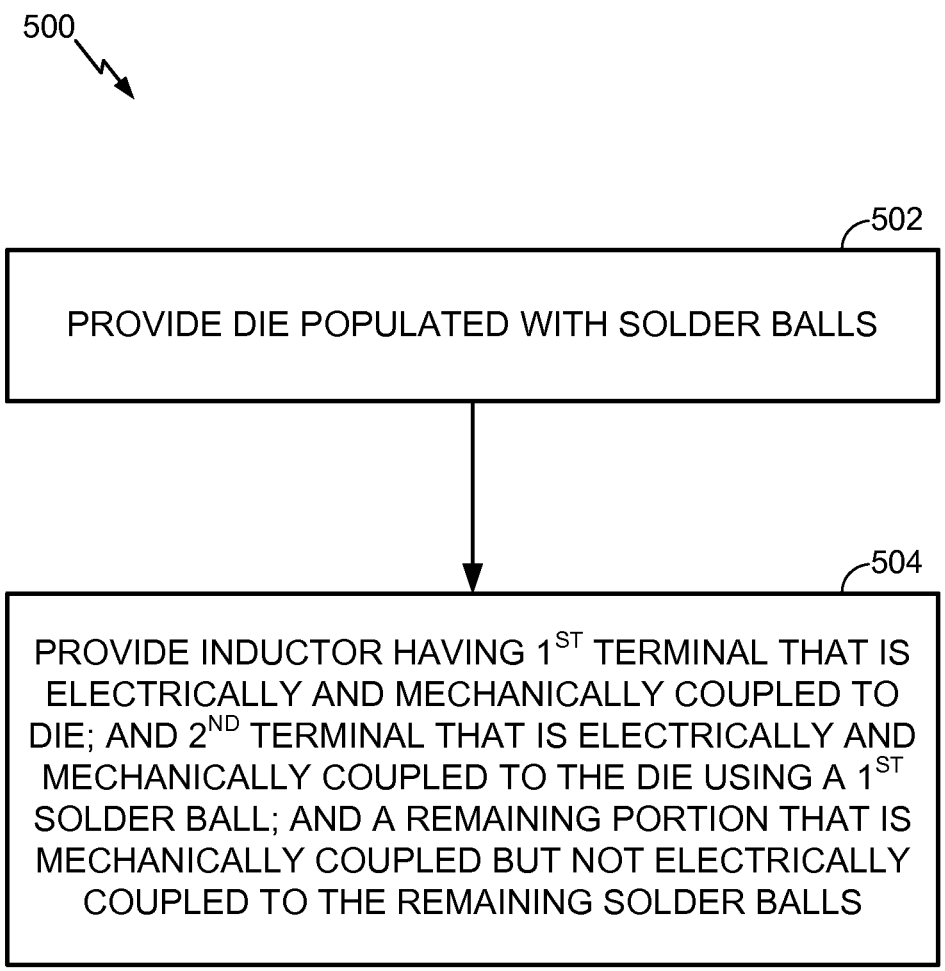
FIG. 5 is a flowchart of a method of making a semiconductor device according to implementations described herein.

FIG. 5 is a flowchart illustrating a method 500 of making the semiconductor device 200 according to one or more implementations of the technology described herein.

In a block 502, the method 500 provides a die that is populated with solder balls. In one or more implementations, the method 500 provides the die 102 that is populated with solder balls 104*a*-104*z*. The die 102 may be manufactured using known techniques such as deposition, photolithography, etching, chemical-mechanical planarization (CMP), and so forth. The die 102 may be populated with solder balls using known techniques such as ball placement systems, stencil printing with alloy solder paste, and the like.

In a block 504, the method 500 provides an inductor in (or on) the die. In one or more implementations, the inductor 202 is disposed in (or on) the die 102 and is formed in a circular pattern around solder balls 104*k*, 104*l*, 104*p*, and 104*q*. The first terminal 204 of the inductor 202 may be electrically and mechanically coupled to the die 102 where the copper redistribution layer (CuRDL) 310 mates with the MA layer 304. The second terminal 206 of the inductor 202 may be electrically and mechanically coupled to the die 102 where the copper redistribution layer (CuRDL) 310 mates with the under bump metallization (UBM) layer 314.

In an alternative implementation, the terminal connections may be reversed. The resulting assembly has improved mechanical stability because none of the solder balls has been depopulated.

Figure 6:
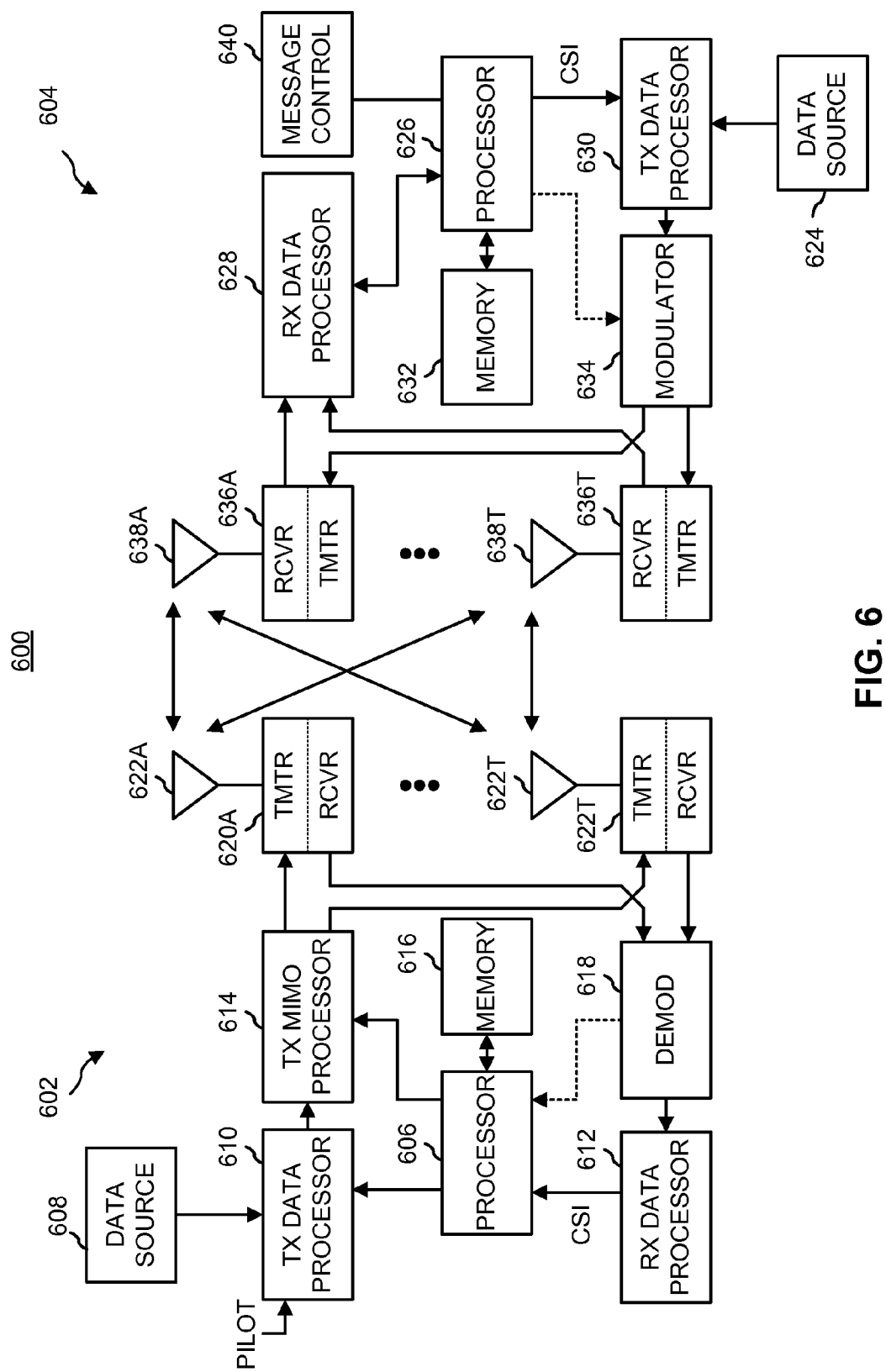
FIG. 6 is a wireless network wherein the technology disclosed herein may be deployed according to implementations described herein.

FIG. 6 is a block diagram of a broadband wireless network 600 according to an example implementation of the technology described herein, in which the inductor 202, semiconductor assembly 300, and/or semiconductor assembly 400 may be implemented. The wireless network 600 includes a user device 602 and a base station 604.

In the illustrated implementation, the user device 602 includes a processor 606, a data source 608, a transmit (TX) data processor 610, a receive (RX) data processor 612, a transmit (TX) (multiple-input multiple-output (MIMO) processor 614, a memory 616, a demodulator (DEMOD) 618, several transceivers 620A through 620T, and several antennas 622A through 622T.

In the illustrated implementation, the user device 602 includes a data source 624, a processor 626, a receive data processor 628, a transmit data processor 630, a memory 632, a modulator 634, several transceivers 636A through 636T, several antennas 638A through 638T, and a message control module 640.

The illustrated user device 602 may comprise, be implemented as, or known as user equipment, a subscriber station, a subscriber unit, a mobile station, a mobile, a mobile node, a remote station, a remote terminal, a user terminal, a user agent, a user device, or some other terminology. In some implementations, the user device 602 may be a cellular telephone, a cordless telephone, a session initiation protocol (SIP) phone, a wireless local loop (WLL) station, a personal digital assistant (PDA), a handheld device having wireless connection capability, or some other suitable processing device connected to a wireless modem. Accordingly, one or more aspects taught herein may be incorporated into a phone (e.g., a cellular phone or smart phone), a computer (e.g., a laptop), a portable communication device, a portable computing device (e.g., a personal data assistant), an entertainment device (e.g., a music device, a video device, or a satellite radio), a global positioning system device, or any other suitable device that is configured to communicate via a wireless medium.

The illustrated base station 604 may comprise, be implemented as, or known as a NodeB, an eNodeB, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other similar terminology.

The illustrated data source 608 provides traffic for a number of data streams to the transmit (TX) data processor 610.

The transmit (TX) data processor 610 formats, codes, and interleaves the traffic data for each data stream based on a particular coding scheme selected for that data stream to provide coded data. The coded data for each data stream may be multiplexed with pilot data using OFDM techniques.

The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols.

The data rate, coding, and modulation for each data stream may be determined by instructions performed by the processor 610. The memory 616 may store program code, data, and other information used by the processor 610 or other components of the user device 602.

The modulation symbols for all data streams are then provided to the TX MIMO processor 614, which may further process the modulation symbols (e.g., for OFDM). The TX MIMO processor 614 then provides $N_T$ modulation symbol streams to the $N_T$ transceivers (XCVR) 620A through 620T. In some implementations, the TX MIMO processor 614 applies beam-forming weights to the symbols of the data streams and to the antenna from which the symbol is being transmitted.

Each transceiver (XCVR) 620A through 620T receives and processes a respective symbol stream to provide one or more analog signals, and further conditions (e.g., amplifies, filters, and upconverts) the analog signals to provide a modulated signal suitable for transmission over the MIMO channel. $N_T$ modulated signals from transceivers (XCVR) 620A through 620T are then transmitted from $N_T$ antennas 622A through 622T, respectively.

At the base station 604, the transmitted modulated signals are received by $N_R$ antennas 638A through 638R and the received signal from each antenna 638A through 638R is provided to a respective transceiver (XCVR) 636A through 636R. Each transceiver (XCVR) 636A through 636R conditions (e.g., filters, amplifies, and downconverts) a respective received signal, digitizes the conditioned signal to provide samples, and further processes the samples to provide a corresponding "received" symbol stream.

The receive (RX) data processor 628 then receives and processes the $N_R$ received symbol streams from the $N_R$ transceivers (XCVR) 636A through 636R based on a particular receiver processing technique to provide $N_T$ "detected" symbol streams. The receive (RX) data processor 628 then demodulates, deinterleaves, and decodes each detected symbol stream to recover the traffic data for the data stream. The processing by the receive (RX) data processor 628 is complementary to that performed by the transmit (TX) MIMO processor 614 and the transmit (TX) data processor 610 at the user device 602.

The processor 626 periodically determines which pre-coding matrix to use (discussed below). The processor 626 formulates a reverse link message comprising a matrix index portion and a rank value portion.

The data memory 632 may store program code, data, and other information used by the processor 626 or other components of the base station 604.

The reverse link message may comprise various types of information regarding the communication link and/or the received data stream. The reverse link message is then processed by a TX data processor 630, which also receives traffic data for a number of data streams from the data source 624, modulated by the modulator 634, conditioned by the transceivers (XCVR) 636A through 636R, and transmitted back to the user device 602.

At the user device 602, the modulated signals from the base station 604 are received by the antennas 622A through 622T, conditioned by the transceivers (XCVR) 620A through 620R, demodulated by a demodulator (DEMOD) 618, and processed by the RX data processor 612 to extract the reverse link message transmitted by the base station 604. The processor 610 then determines which pre-coding matrix to use for determining the beam-forming weights then processes the extracted message.

It should be appreciated that for the user device 602 and the base station 604 the functionality of two or more of the described components may be provided by a single component. For example, a single processing component may provide the functionality of the message control component 640 and the processor 626.

It also should be appreciated that a wireless node may be configured to transmit and/or receive information in a non-wireless manner (e.g., via a wired connection). Thus, a receiver and a transmitter as discussed herein may include appropriate communication interface components (e.g., electrical or optical interface components) to communicate via a non-wireless medium.

The network 600 may implement any one or combinations of the following technologies: Code Division Multiple Access (CDMA) systems, Multiple-Carrier CDMA (MC-CDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, or other multiple access techniques. A wireless communication system employing the teachings herein may be designed to implement one or more standards, such as IS-97, cdma2000, IS-876, W-CDMA, TDSCDMA, and other standards.

A CDMA network may implement a radio technology such as Universal Terrestrial Radio Access (UTRA), cdma2000, or some other technology. UTRA includes W-CDMA and Low Chip Rate (LCR). The cdma2000 technology covers IS-2000, IS-97, and IS-876 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS).

The teachings herein may be implemented in a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2).

Although certain aspects of the disclosure may be described using 3GPP terminology, it is to be understood that the teachings herein may be applied to 3GPP (e.g., Rel99, Rel7, Rel6, Rel7) technology, as well as 3GPP2 (e.g., 1×RTT, 1×EV-DO Rel0, RevA, RevB) technology and other technologies.

Aspects of the technology described herein are disclosed in the following description and related drawings directed to specific implementations of the technology described herein. Alternative implementations may be devised without departing from the scope of the technology described herein. Additionally, well-known elements of the technology described herein will not be described in detail or will be omitted so as not to obscure the relevant details of the technology described herein.

The word "exemplary" is used herein to mean "serving as an example, instance, or illustration." Any implementation described herein as "exemplary" is not necessarily to be construed as preferred or advantageous over other implementations. Likewise, the term "implementations of the technology described herein" does not require that all implementations of the technology described herein include the discussed feature, advantage, or mode of operation.

The terminology used herein is for the purpose of describing particular implementations only and is not intended to be limiting of implementations of the technology described herein. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many implementations are described in terms of sequences of actions to be performed by, for example, elements of a computing device. It will be recognized that various actions described herein can be performed by specific circuits (e.g., application specific ICs (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the technology described herein may be embodied in a number of different forms, all of which have been contemplated to be within the scope of the claimed subject matter. In addition, for each of the implementations described herein, the corresponding form of any such implementations may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the implementations disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present technology described herein.

The methods, sequences, and/or algorithms described in connection with the implementations disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an implementation of the technology described herein can include a computer-readable media embodying a method of manufacturing a semiconductor device. Accordingly, the technology described herein is not limited to illustrated examples, and any means for performing the functionality described herein are included in implementations of the technology described herein.

While the foregoing disclosure shows illustrative implementations of the technology described herein, it should be noted that various changes and modifications could be made herein without departing from the scope of the technology described herein as defined by the appended claims. The functions, steps, and/or actions of the method claims in accordance with the implementations of the technology described herein described herein need not be performed in any particular order. Furthermore, although elements of the technology described herein may be described or claimed in the singular, the plural is contemplated unless limitation to the singular is explicitly stated.

What is claimed is:

1. A semiconductor device, comprising:
    a die populated with a first interconnect and a plurality of remaining interconnects; and
    an inductor disposed in the die, the inductor comprising:
        a first terminal that is electrically and mechanically coupled to the die;
        a second terminal that is electrically and mechanically coupled to the die using the first interconnect; and
        a remaining portion of the inductor that is mechanically coupled to the plurality of remaining interconnects but not electrically coupled to the plurality of remaining interconnects.

2. The semiconductor device of claim 1, wherein the first interconnect is electrically coupled to the die using an under bump metallization (UBM) layer.

3. The semiconductor device of claim 1, integrated in at least one of a wafer level package (WLP), flip-chip ball grid array (FCBGA) package, and a flip-chip chip-scale package (FCCSP).

4. The semiconductor device of claim 1, wherein the inductor is disposed in a single layer on the die.

5. The semiconductor device of claim 1, wherein the inductor is two-dimensional.

6. A method of manufacturing a semiconductor device, the method comprising:
    providing a die populated with a first interconnect and a plurality of remaining interconnects; and
    disposing an inductor in the die, wherein disposing the inductor in the die comprises:
        forming a first terminal of the inductor and electrically and mechanically coupling the first terminal to the die;
        forming a second terminal of the inductor and electrically and mechanically coupling the second terminal to the die using the first interconnect; and
        forming a remaining portion of the inductor and mechanically coupling the remaining portion of the inductor to the plurality of remaining interconnects but not electrically coupling the remaining portion of the inductor to the plurality of remaining interconnects.

7. The method of claim 6, wherein the first interconnect is electrically coupled to the die using an under bump metallization (UBM) layer.

8. The method of claim 6, further comprising integrating the semiconductor device in at least one of a wafer level package (WLP), flip-chip ball grid array (FCBGA) package, a package-on-package (PoP) package, and a flip-chip chip-scale package (FCCSP).

9. The method of claim 6, wherein providing the inductor disposed in the die includes disposing the inductor in a single layer on the die.

10. The method of claim 6, wherein the inductor is two-dimensional.

11. The method of claim 6, further comprising:
    providing a metal layer in the die;
    providing a copper redistribution layer on the metal layer;
    providing a passivation layer on the copper redistribution layer; and
    providing an under bump metallization (UBM) layer that is partially disposed on the polyimide layer and partially disposed on the copper redistribution layer.

12. A semiconductor device, comprising:
    means for providing a die populated with a first interconnect and a plurality of remaining interconnects; and
    means for disposing an inductor in the die, wherein the means for disposing the inductor in the die comprises:
        means for forming a first terminal;
        means for electrically and mechanically coupling the first terminal to the die;
        means for forming a second terminal;
        means for electrically and mechanically coupling the second terminal to the die using the first interconnect;
        means for forming a remaining portion of the inductor; and
        means for mechanically coupling the remaining portion of the inductor to the plurality of remaining interconnects but not electrically coupling the remaining portion of the inductor to the plurality of remaining interconnects.

13. The semiconductor device of claim 12, wherein the means for electrically and mechanically coupling the first terminal to the die comprises means for electrically coupling the first terminal to the die using an under bump metallization (UBM) layer.

14. The semiconductor device of claim 12, further comprising means for integrating the semiconductor device in at least one of a wafer level package (WLP), flip-chip ball grid array (FCBGA) package, a package-on-package (PoP) package, and a flip-chip chip-scale package (FCCSP).

15. The semiconductor device of claim 12, wherein the means for disposing the inductor in the die further comprises means for disposing the inductor in a single layer on the die.

16. The semiconductor device of claim 12, wherein the means for disposing the inductor in the die further comprises means for disposing a two-dimensional inductor in the die.

17. The semiconductor device of claim 12, further comprising:
    means for providing a metal layer in the die;
    means for providing a copper redistribution layer on the metal layer;
    means for providing a passivation layer on the copper redistribution layer; and
    means for providing an under bump metallization (UBM) layer that is partially disposed on the polyimide layer and partially disposed on the copper redistribution layer.

18. A non-transitory computer-readable storage medium including data that, when accessed by a machine, cause the machine to perform operations comprising:
    providing a die populated with a first interconnect and a plurality of remaining interconnects; and
    disposing an inductor in the die, wherein disposing the inductor in the die comprises:
        forming a first terminal of the inductor and electrically and mechanically coupling the first terminal to the die;

forming a second terminal of the inductor and electrically and mechanically coupling the second terminal to the die using the first interconnect; and forming a remaining portion of the inductor and mechanically coupling the remaining portion of the inductor to the plurality of remaining interconnects but not electrically coupling the remaining portion of the inductor to the plurality of remaining interconnects.

19. The non-transitory computer-readable storage medium of claim 18, wherein the first interconnect is electrically coupled to the die using an under bump metallization (UBM) layer.

20. The non-transitory computer-readable storage medium of claim 18, wherein the operations further comprise integrating the semiconductor device in at least one of a wafer level package (WLP), flip-chip ball grid array (FCBGA) package, a package-on-package (PoP) package, and a flip-chip chip-scale package (FCCSP).

21. The non-transitory computer-readable storage medium of claim 18, wherein providing the inductor disposed in the die includes disposing the inductor in a single layer on the die.

22. The non-transitory computer-readable storage medium of claim 18, wherein the inductor is two-dimensional.

23. The non-transitory computer-readable storage medium of claim 18, wherein the operations further comprise:
 providing a metal layer in the die;
 providing a copper redistribution layer on the metal layer;
 providing a passivation layer on the copper redistribution layer; and
 providing an under bump metallization (UBM) layer that is partially disposed on the polyimide layer and partially disposed on the copper redistribution layer.

\* \* \* \* \*